(12) United States Patent
Dos Santos Paes

(10) Patent No.: US 11,466,777 B2
(45) Date of Patent: Oct. 11, 2022

(54) SLIDING ELEMENT FOR AN INTERNAL COMBUSTION ENGINE

(71) Applicants: Mahle Metal Leve S/A, Jundiai (BR); Mahle International GmbH, Stuttgart (DE)

(72) Inventor: Eliel Dos Santos Paes, Jundidai (BR)

(73) Assignee: Mahle International GmbH

( * ) Notice: Subject to any disclaimer, the term of this patent is extended or adjusted under 35 U.S.C. 154(b) by 881 days.

(21) Appl. No.: 16/321,459

(22) PCT Filed: Jul. 27, 2017

(86) PCT No.: PCT/EP2017/069011
§ 371 (c)(1),
(2) Date: Jan. 28, 2019

(87) PCT Pub. No.: WO2018/019940
PCT Pub. Date: Feb. 1, 2018

(65) Prior Publication Data
US 2021/0277996 A1    Sep. 9, 2021

(30) Foreign Application Priority Data

Jul. 29, 2016  (BR) .......................... 102016017735 9

(51) Int. Cl.
*F16J 9/26*    (2006.01)
*F16J 9/12*    (2006.01)
(Continued)

(52) U.S. Cl.
CPC ............... *F16J 9/26* (2013.01); *C23C 14/025* (2013.01); *C23C 14/0611* (2013.01);
(Continued)

(58) Field of Classification Search
CPC ....... F16J 9/26; F16J 9/12; F02B 77/02; F02F 5/00; C23C 14/025; C23C 14/0605;
(Continued)

(56) References Cited

U.S. PATENT DOCUMENTS 8,123,227 B2  2/2012  Kawanishi et al.
9,086,148 B2  7/2015  Kennedy
(Continued)

FOREIGN PATENT DOCUMENTS

CN  102741535 A  10/2012
EP  3196332 A1  7/2017
(Continued)

OTHER PUBLICATIONS

A. C. Ferrari et al: Interpretation of Raman spectra of disordered and amorphous carbon, Physical Review, B. Condensed Matter., vol. 61, No. 20, May 15, 2000 (May 15, 2000), pp. 14095-14107.
(Continued)

*Primary Examiner* — Grant Moubry
(74) *Attorney, Agent, or Firm* — Fishman Stewart PLLC

(57) ABSTRACT

A sliding element for an internal combustion engine may include a base material having an annular external surface. The external surface may include a bonding layer, a first layer of coating, and a second layer of coating sequentially disposed thereon. The first layer of coating and the second layer of coating may include hard amorphous carbon (DLC) of a combined matrix having a plurality of sp3/sp2 bonds. The first layer of coating may include 45% sp3 bonds or less and may have a thickness of at least 10 micrometers. The second layer of coating may include at least 55% sp3 bonds and may have a thickness of at least 3 micrometers.

20 Claims, 4 Drawing Sheets

(51) Int. Cl.
    C23C 14/02    (2006.01)
    C23C 14/06    (2006.01)
    C23C 28/00    (2006.01)
    C23C 28/04    (2006.01)
(52) U.S. Cl.
    CPC .......... *C23C 28/044* (2013.01); *C23C 28/046* (2013.01); *C23C 28/321* (2013.01); *C23C 28/343* (2013.01); *F16J 9/12* (2013.01)
(58) Field of Classification Search
    CPC . C23C 14/0611; C23C 28/044; C23C 28/046; C23C 28/321; C23C 28/343
    See application file for complete search history.

(56) References Cited

U.S. PATENT DOCUMENTS

| | | | |
|---|---|---|---|
| 9,464,717 B2 | 10/2016 | Ito et al. | |
| 2003/0180572 A1* | 9/2003 | Norito | C23C 30/00 428/673 |
| 2011/0076476 A1* | 3/2011 | Chouquet | C23C 16/26 428/216 |
| 2015/0292622 A1* | 10/2015 | Kennedy | F16J 9/26 277/442 |
| 2017/0253825 A1* | 9/2017 | Tsuji | C23C 14/0605 |
| 2018/0245200 A1* | 8/2018 | Shinohara | F16C 33/043 |

FOREIGN PATENT DOCUMENTS

| | | |
|---|---|---|
| JP | 2004-10923 A | 1/2004 |
| JP | 2007-246996 A | 9/2007 |
| WO | WO-2016/042945 A1 | 3/2016 |

OTHER PUBLICATIONS

Vetter J Ed—Montemor Fatima: "60 years of DLC coatings: Historical highlights and technical review of cathodic arc processes to synthesize various DLC types, and their evolution for industrial applications", Surface and Coatings Technology, vol. 257, Aug. 27, 2014 (Aug. 27, 2014), pp. 213-240.
English abstract for JP-2004-10923.
Chinese Office Action dated Apr. 1, 2020 for copending Chinese Application No. 201780040902.X.

* cited by examiner

State of the art      Present Invention

SLIDING ELEMENT FOR AN INTERNAL COMBUSTION ENGINE

CROSS-REFERENCE TO RELATED APPLICATIONS

This application claims priority to International Patent Application No. PCT/EP2017/069011, filed Jul. 27, 2017, and Brazilian Patent Application No. BR 10 2016 017735 9, filed on Jul. 29, 2016, the contents of both of which are hereby incorporated by reference in their entirety.

TECHNICAL FIELD

The present invention relates to a sliding element, such as a piston ring for internal combustion engines, provided with a coating comprising two layers of hard amorphous carbon and having a roughness profile capable of bringing about a good condition for running in and better contact between two sliding surfaces, in addition to reducing the friction and the wear, and ensuring high hardness.

BACKGROUND

Internal combustion engines, whether of Diesel cycle, Otto cycle, two or three stroke, comprise at least one piston ring. The piston ring acts in the sealing of the space between the cylinder liner and the body of the piston, isolating the combustion chamber from the other internal components of the engines. The piston ring is disposed radially upon the base of the body of the piston, preventing the combustion gases from escaping from the combustion chamber in the direction of the sump and preventing the engine oil from penetrating into the combustion chamber.

Normally, the engines are provided with three rings located parallelly in grooves disposed in the base of the piston body, being two compression rings and one oil scraper ring. The compression rings are located closer to the head of the piston and seal the clearance existing between piston and liner, rendering it possible that the piston may compress the air-fuel mixture for the burning and subsequently maintain the hermeticity of the cylinder. The oil scraper rings have the obvious function of scraping the excess of lubricant oil thrown under pressure onto the wall of the liners.

Some internal combustion engines, principally engines operating with the Diesel cycle, work under high loads. Other examples may be found in high performance petrol engines. Independently of the examples which may be cited, there is a trend for the engines to operate under high speed and high power, reduced clearances and, consequently, are subject to a severe tribological regime. Such conditions are naturally more exacting in respect of the mechanical components thereof. In this sense the rings utilized in these engines of high power or performance require low friction, high hardness and high resistance to wear.

Furthermore, it is important to stress that the environmental impact of the internal combustion engines, when taken together with the need for high performance and durability, results in a general manner in the need to work with tighter tolerances, this naturally being translated into the utilization of increasingly thin layers of lubricant oils.

In addition to being thinner, the layers of lubricant oils are also obtained by means of oils of low viscosity, ensuring lower friction between the sliding components. Nevertheless, the thinner the film of oil and the lower the viscosity thereof the greater the probability of contact between the sliding components.

In general terms, the application of layers of coating upon rings for engines working under high loads is realized through processes of deposition of vapor, especially physical vapor deposition (PVD) and plasma assisted chemical vapor deposition (PACVD) processes. Heavy duty Diesel engines were the first to utilize chromium nitride (CrN) coating applied by cathodic arc deposition (Arc-PVD). In recent years the coatings applied by PVD have also come to be utilized upon piston rings for light duty engines, both petrol and Diesel, by virtue of the excellent resistance to wear with ensured durability.

The piston rings presented in the state of the art generally comprise coatings of hard amorphous carbon, also known as diamond like carbon (DLC) or hydrogen free hydrogenated DLC nanostructure, as a solution to achieve low friction and high resistance to wear. As a rule the solutions of the state of the art apply the coating of DLC in a composition incorporating $sp^3$ (diamond type) and $sp^2$ (graphite type) bonds. Nevertheless, it should be noted that, by virtue of the tridimensional (3D) structure of the $sp^3$ bonds, the hardness thereof exceeds that encountered in the $sp^2$ bonds.

For a better understanding, the $sp^2$ structures, by virtue of conferring characteristics of an extremely soft and lubricant material, are important to facilitate the bedding in of the ring within the cylinder liner and counterbalance the $sp^3$ structures in contact with the cylinder liner. Such concern is extremely valid by virtue of the fact that, in addition to the $sp^3$ structure being capable of scoring the cylinder liner, the concentration of stresses present in the $sp^3$ structures is very high, such that it may generate disastrous consequences both for the cylinder liner, scoring it, and for the coating, rendering the possibility of the occurrence of cracks and the propagation thereof, consequently leading to the diminution of the working life of the components. For such reason diverse solutions of the state of the art changed to the utilization of DLC coatings presenting a predominance of $sp^2$ bonds, having the objective of reducing the friction and internal stresses.

The document U.S. Pat. No. 9,086,148 reveals a sliding element, in particular a piston ring, provided with a DLC coating whereupon are deposited, sequentially, an adhesive layer containing a metal and a DLC-type ta-C layer having a thickness of at least 10 micrometers, wherein the coating contains a finishing layer having a thickness of from 1 to 3 micrometers, wherein the quantity of $sp^3$ bonds diminishes to values of less than 40%, with a view to ensuring that a greater quantity of $sp^2$ is present in this second layer for running the ring in within the cylinder.

Other solutions of the state of the art present DLC coatings having a refined surface finish having a roughness profile comprising low values of peaks (Rpk), of less than 0.1 micrometers, and high values of the proportion of material of a surface (Rmr). The roughness parameter Rpk relates to the average roughness value of peaks of a surface and the parameter Rmr represents how much contact exists between two surfaces. The lower the Rpk, the lower the probability of the piston ring scoring the cylinder liner when running in, and the higher the Rmr the greater the support and the contact between the ring and the liner.

The patent document U.S. Pat. No. 8,123,227 reveals a sliding element provided with a DLC coating, wherein the DLC layer is deposited upon a base material formed by chromium (Cr), or a nitrided material, or chromium nitride (CrN), the DLC layer comprising a thickness of between 0.01 and 2 micrometers, having a hardness equal to or exceeding 20 GPa, presenting a roughness profile comprising an Rpk of between 0.07 and 0.14 micrometers and an Rz equal to or less than 0.7 micrometers, and a cylinder liner having a roughness Rz of between 2 and 4 micrometers.

In this manner, when applied upon a piston ring the DLC coating presents at least three characteristics which, in combination, result in greater resistance to wear, greater hardness and less friction, these being: percentage of $sp^3/sp^2$ bonds in the DLC matrix, thickness of the coating layer and magnitude of values for parameters of roughness in terms of peaks (Rpk) and of contact between sliding surfaces (Rmr).

It is important to note that for very thin DLC coatings, that is to say of small thickness, high values of Rmr may be readily achieved, by virtue of the fact that the base material of the ring presents a very smooth surface and a thin layer of coating is not capable of markedly increasing the roughness of the surface. However, when thicker layers of DLC are applied, of the order of 10 micrometers, there is difficulty in achieving high values of Rmr. For example, on taking as reference the parameter of roughness Rz, representing the distance between the highest peak (Rpk) and the deepest valley (Rvk), a base material having an Rz of the order of 0.5 micrometers, following the application of a coating of 10 micrometers, may attain values of Rz of between 4 and 5 micrometers, that is to say an excessively rough surface.

In terms of the ratio of $sp^3/sp^2$ bonds in the DLC matrix, in addition to the difference in the structure of the bonds, the fact is that different percentages of $sp^3$ comprise different rates of deposition such that the lower the percentage of $sp^3$ the more rapid will be the deposition of the layer. For example, a layer having a percentage of $sp^3$ bonds of between 35% and 45% is deposited at an average rate of 0.6-0.9 microns/hour, whilst a layer having a percentage of $sp^3$ bonds of between 55% and 65% is deposited at an average rate of 0.2-0.5 microns/hour. In this manner, the speed whereat the layer is deposited upon the surface of the ring may be higher or lower depending on the percentage of $sp^3$ bonds contained in the DLC matrix, a factor which directly affects the costs of the product.

Furthermore, layers having a percentage of $sp^3$ of between 55% and 65% are capable of receiving better finishes than layers having a percentage of $sp^3$ of between 35% and 45%. In this respect, for piston rings comprising a DLC coating, it is of great importance that the final finished surface be the most highly polished possible such as to present good compatibility with the cylinder, by virtue of the fact that the hardness of the cylinder liner is considerably lower, usually less than 7000 MPa, than the hardness of the DLC coating, exceeding 15 GPa.

SUMMARY

In this manner, the present invention presents a sliding element, such as a piston ring, provided with a coating of hard amorphous carbon (DLC) comprising two layers having a percentage of $sp^3$ bonds and thickness differing for each layer, this ensuring a good rate of deposition of the coating together with a superior finish for a DLC coating of at least 10 micrometers thickness and having a roughness profile presenting an excellent finish capable of bringing about a good running in condition and better contact between two sliding surfaces.

A first object of the present invention is to provide a sliding element for internal combustion engines provided with a coating of hard amorphous carbon comprising two layers, being an internal layer having a low percentage of $sp^3$ bonds and great thickness, and an external layer having a high percentage of $sp^3$ bonds and small thickness, obtaining a good rate of deposition of the coating for the internal layer and a good finish for the external layer.

And, additionally, an object of the present invention is to provide a sliding element provided with a coating of hard amorphous carbon comprising a minimum thickness of 10 micrometers having a roughness profile presenting low values of Rpk and high values of Rmr, bringing about greater support and contact between two sliding surfaces, in addition to good running in conditions, diminishing the probability of scoring occurring upon the sliding surfaces.

And, finally, an object of the present invention is to provide a sliding element provided with a hard amorphous carbon coating capable of ensuring high hardness in the band from 25 GPa to 50 GPa.

The objects of the present invention are achieved by a sliding element for internal combustion engines comprising a base material provided with an annular external surface whereupon there is deposited, sequentially, a bonding layer, a first layer of coating and a second layer of coating, the first and second layers of coating being composed by hard amorphous carbon (DLC) of a combined matrix having $sp^3/sp^2$ bonds, the first layer of coating comprising up to 45% $sp^3$ bonds and a thickness of at least 10 micrometers, and the second layer of coating comprising at least 55% $sp^3$ bonds and a thickness of at least 3 micrometers, the thickness of the total layer of coating, the first layer of coating being added to the second layer of coating, being of at least 13 micrometers.

The objects of the present invention are, additionally, achieved by a sliding element comprising the second layer of coating presenting a roughness profile having an Rmr (0.3-0.5) equal to or exceeding 50%, and/or having an Rmr (0.4-0.5) equal to or exceeding 70% and an Rpk of less than 0.07 micrometers, and an Rz of less than 1 micrometer, presenting a hardness ranging between 25 GPa and 50 GPa.

The objects of the present invention are, furthermore, achieved by a sliding element whereof the bonding layer is composed by one of the materials from among metallic chromium (Cr), or nickel (Ni), or cobalt (Co), or tungsten (W), or chromium carbide (CrC), being deposited by a physical vapor deposition (PVD) process, and the base material being composed by a ferrous metal.

Moreover, the objects of the present invention are achieved by a sliding element, preferentially a piston ring, and an internal combustion engine comprising at least one sliding element.

BRIEF DESCRIPTION OF THE DRAWINGS

The present invention shall be described hereinbelow in greater detail, based upon an example of embodiment represented in the drawings. The figures show.

DETAILED DESCRIPTION

The present invention relates to a sliding element, such as a piston ring 10 for internal combustion engines, provided with a coating comprising two layers 14, 15 of hard amorphous carbon and having a roughness profile capable of bringing about a good running in condition and better contact between two sliding surfaces, in addition to reducing the friction and the wear, ensuring high hardness.

The sliding element of the present invention may be an engine component maintaining contact with a thin layer of lubricant fluid, experiencing wear, such as, for example and inter alia, a cylinder liner, an oil scraper piston ring, a first groove piston ring.

Figure 1:
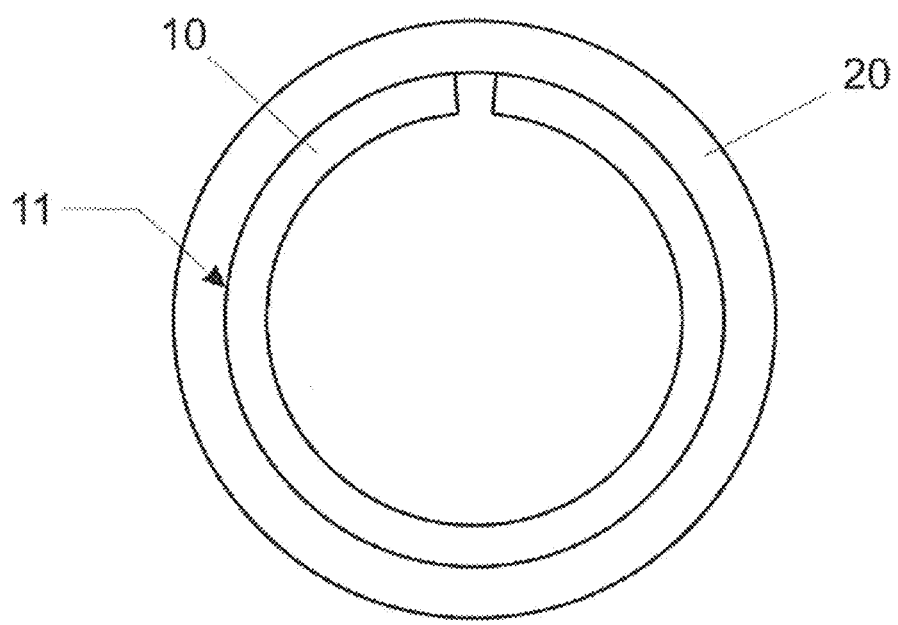
FIG. 1: a representation of the disposition of a piston ring within the interior of a cylinder of an internal combustion engine.

Firstly, it must be noted that the sliding element of the present invention is preferentially a piston ring 10 for internal combustion engines operating under high load and/or power, as illustrated in FIG. 1. These piston rings usually operate with very fine tolerances and a thin film of oil to ensure excellent performance and low emissions of $CO_2$.

The piston ring 10 of the present invention comprises a base material 12 provided with an annular external surface 11, being composed, preferentially, by a ferrous metal, for example a stainless steel having 10% to 17% of chromium or a carbon steel. The annular external surface 11 corresponds to the portion of the ring parallel to and facing the region of contact with a cylinder liner 20, in other words it is the surface acting as interface between the ring and a cylinder liner 20, it being upon the external surface 11 that the coating is deposited.

Figure 2:
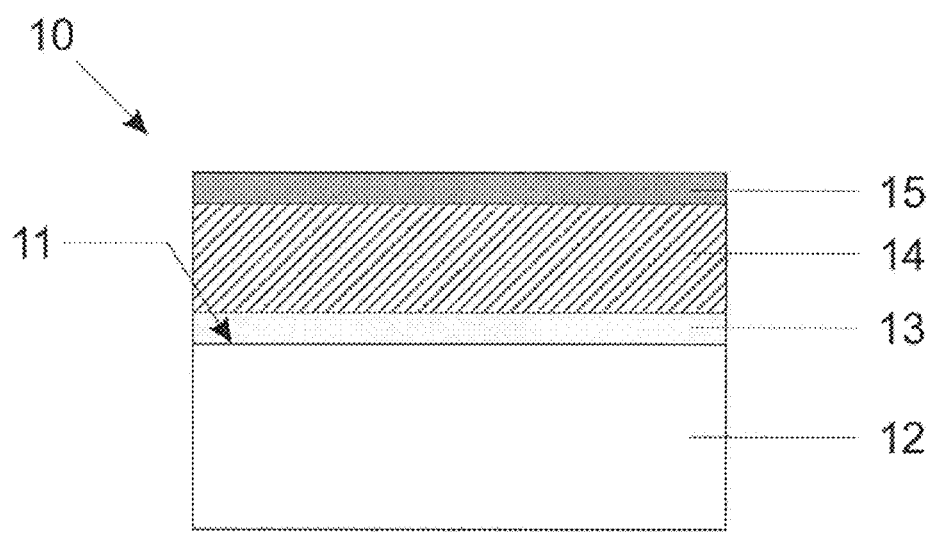
FIG. 2: a representation of a cross-section of the piston ring, revealing the structure of the coating of the present invention.

In a preferential configuration, illustrated in FIG. 2, the external surface 11 receives, sequentially, a bonding layer 13 and, upon the bonding layer 13, a first layer of coating 14 and a second layer of coating 15, the first and second layers of coating 14, 15 being composed by hard amorphous carbon of the a-C/ta-C type.

The bonding layer 13 has the objective of bringing about the relieving of the stresses between the metal structure of the ring and the coating of hard amorphous carbon, in this manner ensuring an excellent adhesion between the coating and the base material 12. In a preferential manner, not however obligatory, the bonding layer 13 is formed by metallic chromium (Cr). In an alternative preferential configuration, the bonding layer 13 is composed by one from among the materials such as nickel (Ni), cobalt (Co), tungsten (W), chromium carbide (CrC) or by a ceramic material. The bonding layer 13 comprises a thickness of less than 3 micrometers, preferentially between 1 micrometer and 3 micrometers, and is deposited by a physical vapor deposition (PVD) process.

In turn, the first and second layers of coating 14, 15 are formed of hard amorphous carbon (DLC), the carbon being totally amorphous carbon free, or substantially free, of hydrogen, comprising less than 2% by weight of hydrogen.

In a manner differing from the solutions found in the state of the art, the present invention presents a coating of hard amorphous carbon comprising a dual layer, that is to say two deposited layers, each layer comprising matrices of $sp^2/sp^3$ bonds and differing thicknesses, in addition to utilizing a specially developed topography upon the surface of contact of the coating capable of presenting good compatibility with the contact surface of the cylinder liner 20.

In order to achieve the objects of the present invention, the first layer of coating 14, deposited upon the bonding layer 13, is composed by hard amorphous carbon, comprising up to 45% of $sp^3$ bonds and having a thickness equal to or exceeding 10 micrometers. In this preferential configuration of the first layer 14, the low percentage of $sp^3$ bonds, equal to or less than 45%, has as objective the optimization of the rate of deposition of the coating of the first layer, in addition to relieving and reducing internal stresses.

Furthermore, upon the first layer of coating 14 there is deposited a second layer of coating 15 composed by hard amorphous carbon comprising at least 55% $sp^3$ bonds and having a thickness equal to or exceeding 3 micrometers. Differing from the first layer of coating 14, the second layer of coating 15 comprises a high percentage of $sp^3$ bonds, equal to or exceeding 55%, and has the objective of ensuring an excellent finish of the coating, in addition to high hardness.

The thickness of the total layer of coating, the first layer of coating 14 being added to the second layer of coating 15, is at least 13 micrometers, preferentially 15 micrometers, wherewith a better correlation is achieved between rate of deposition, internal stress, finish, hardness and thickness of coating. In terms of hardness, the second layer of coating 15 is of between 25 GPa and 50 GPa and utilizes a specially developed finish upon the surface of contact of the coating capable of preventing high wear and reducing the probability of scoring the cylinder liner, the hardness whereof is considerably lower. Both the hardness and the optimized finish are observed upon the second layer of coating 15, by virtue of the fact that this represents the most external layer of the coating, entering into direct contact with the contact surface of the cylinder liner 20.

The process of deposition of the coating, comprising the first layer of coating 14 and the second layer of coating 15, occurs through a process of vapor deposition (PVD).

Contributing greatly to the excellent results of the present invention, the surface of the second layer of coating 15 comprises a topography the contact whereof with the contact surface of the cylinder liner 20 occurs, principally, by means of peaks of less than 0.1 micrometers, presenting high support and better contact between the sliding surfaces.

The standard ISO 4287 defines the parameters of roughness for a proportion of material of a surface (Rmr), reflecting the percentage of material at a given depth measured from a reference line, and represents how much contact exists between two surfaces. For a better understanding, in terms of an example for a topography comprising many peaks the Rmr tends to be lower, in detriment to the support and contact between the surfaces. On the other hand, a topography comprising low peaks, for example less than 0.1 micrometers, tends to present a high Rmr, indicating that the proportion of material in the surface is greater. In this manner, the values of Rmr are of great importance for characterizing the roughness profile of a surface, by virtue of the fact that such values permit the comprehension of the specific topography and obtainment of a solution having low friction and wear and high durability.

Consequently, in order to improve the support and the contact between the sliding surfaces it is necessary to obtain a high Rmr, whether through the reduction in the number of peaks or the reduction of the magnitude/height of these peaks. Rpk is the roughness parameter indicating the quantity and the height of the peaks of a surface.

In addition to the support and the contact between the surfaces, the presence of peaks brings about scoring and the critical wear upon the surface of contact of the cylinder liner 20 by virtue of the high contact pressure. Furthermore, this local high pressure renders difficult the formation and the maintenance of the film of lubricant oil even though there is oil present in the valleys of the second layer of coating 15 of hydrogen free amorphous carbon (DLC).

Consequently, in order to resolve the problems of the state of the art, a surface has been developed possessing peaks of low magnitude/height, of less than 0.1 micrometers, having the objective of ensuring good support in the contact between the piston ring 10 and the cylinder liner 20. For the same load, this surface generates a low contact pressure when compared with a topography containing high peaks. In this manner the finish of the piston ring 10 is of great importance for the realization of the contact between the ring 10 and the liner 20, in this way contributing to good operation of the engine. The good compatibility between the piston ring 10 and the cylinder liner 20 is obtained through processes of smoothing and lapping to reduce the height of the peaks upon the second layer of coating 15, which process occurs subsequent to the deposition of the coating.

In this respect the coating of the present invention presents the second layer of coating 15 having an Rpk of less than 0.07 micrometers, that is to say peaks having a magnitude/height of less than 0.07 micrometers.

Consequently, the present invention has as characteristic of the topography of the second layer of coating 15 the presentation of an Rmr(0.3-0.5) equal to or exceeding 50% and/or an Rmr(0.4-0.5) equal to or exceeding 70%.

In addition to the Rpk and Rmr, the second layer of coating 15 presents an Rz of less than 1 micrometer.

The laboratory results obtained during the development of the sliding element of the present invention are presented in FIGS. 3 to 8 and clearly show the differences and advantages of the present invention in relation to the state of the art.

Figure 3:
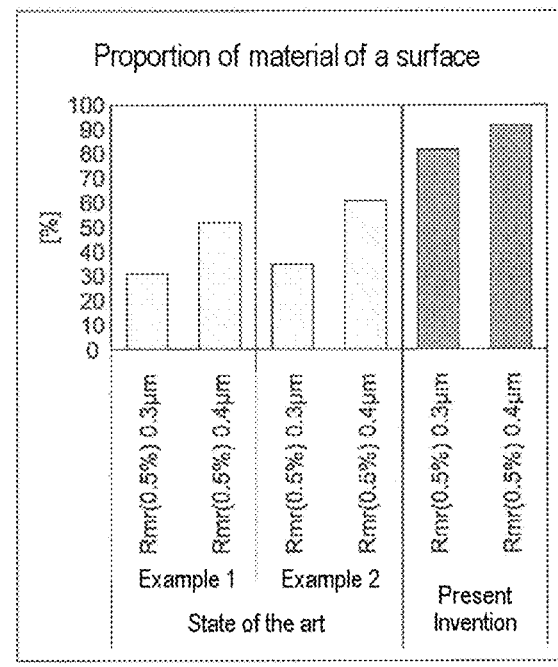
FIG. 3: a graphic comparing the values of Rmr obtained in the state of the art and in the present invention.

FIG. 3 shows the values of Rmr obtained for rings of the state of the art and of the present invention. In this respect, rings were tested provided with a coating of hard amorphous carbon having a thickness equal to or exceeding 10 micrometers and up to 40% of $sp^3$ bonds, as revealed by the document of the state of the art U.S. Pat. No. 9,086,148, referred to hereinbefore.

The results of FIG. 3 show that the coating of hard amorphous carbon revealed by the present invention presents values of Rmr exceeding the values achieved in the state of the art. The rings of the state of the art present a roughness profile having an Rmr(0.3-0.5) of between 30% and 40% and an Rmr(0.4-0.5) of between 50% and 60%, whereas the rings of the present invention achieve values of Rmr(0.3-0.5) of between 80% and 90% and of Rmr(0.4-0.5) exceeding 90%.

Figure 4:
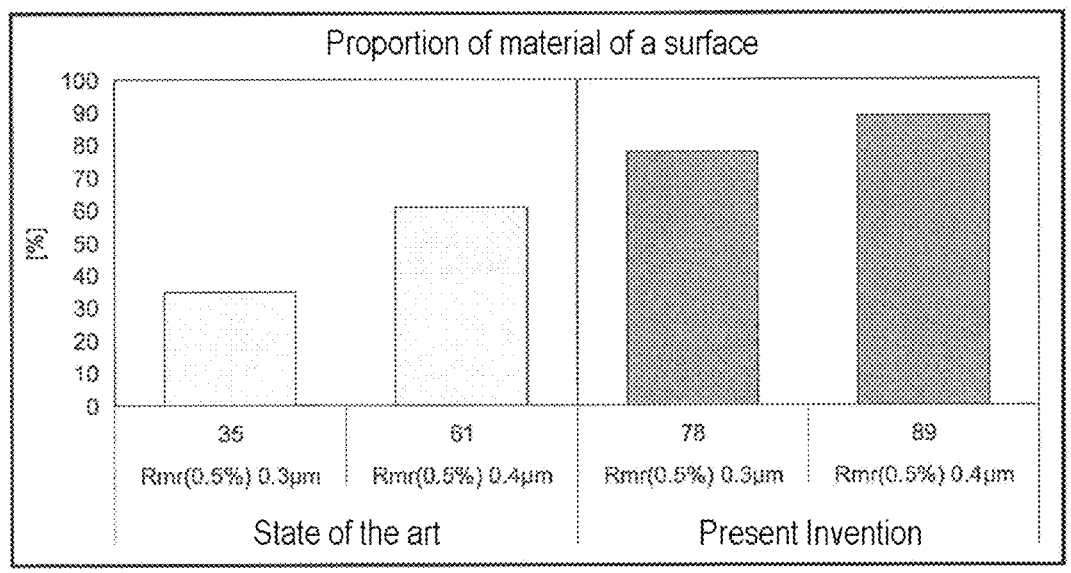
FIG. 4: a graphic comparing the values of Rmr obtained in the state of the art and in the present invention.

In the same manner, FIG. 4 shows results from a second test wherein the rings of the state of the art present an Rmr(0.3-0.5) of 35% and an Rmr(0.4-0.5) of 61%, whilst the rings of the present invention attain an Rmr(0.3-0.5) of 78% and an Rmr(0.4-0.5) of 89%.

Figure 5:
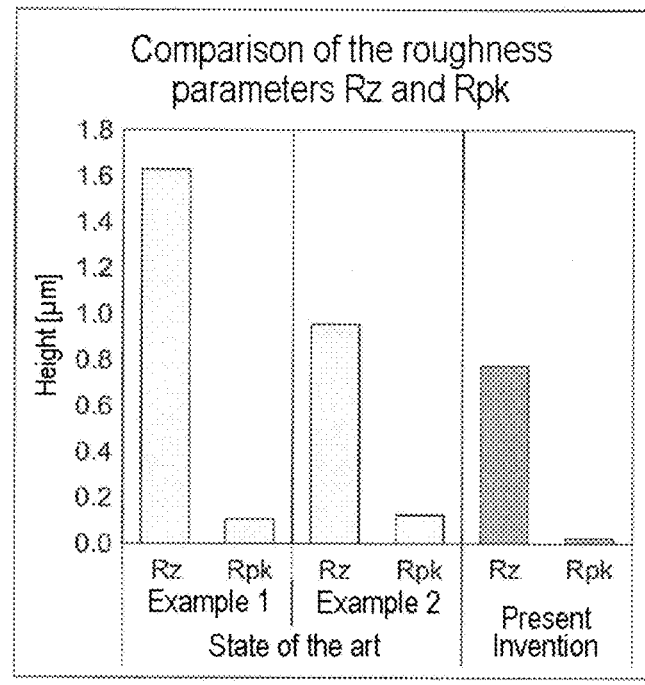
FIG. 5: a graphic comparing the values of Rz and Rpk obtained in the state of the art and in the present invention.

FIG. 5 shows the values obtained for the magnitude/height of peaks and valleys upon rings of the state of the art and of the present invention. It may be observed that the rings of the state of the art comprise values of Rz exceeding 0.8 micrometers and an Rpk of the order of 0.1 micrometers, whilst the rings of the present invention present low values of Rz and Rpk, having an Rz of between 0.6 and 0.8 micrometers and an Rpk of less than 0.1 micrometers.

Figure 6:
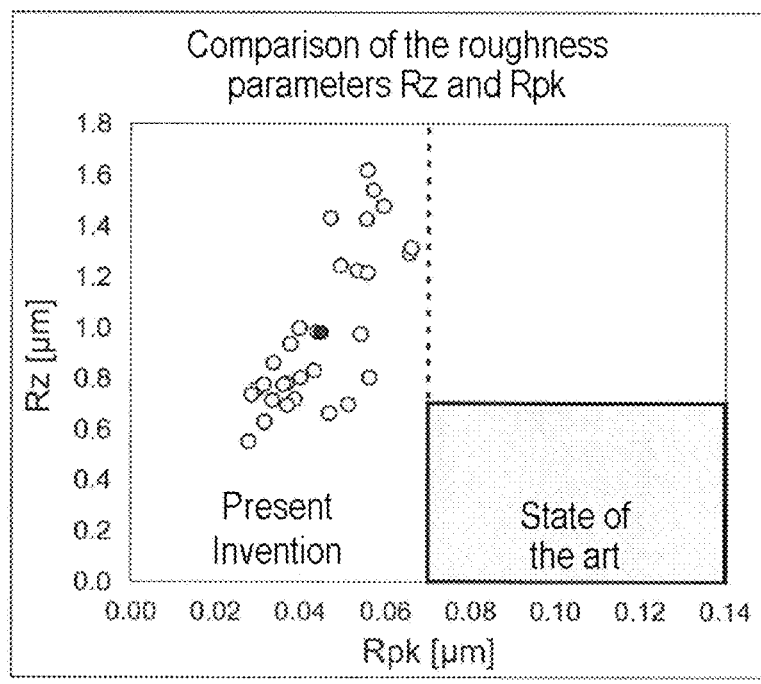
FIG. 6: a graphic comparing the values of Rz and Rpk obtained in the state of the art and in the present invention.

FIG. 6 shows the values of Rz and Rpk obtained in the present invention in comparison with the values revealed in the state of the art, represented by the document U.S. Pat. No. 8,123,227, referred to hereinbefore. The lighter points of the graphic of the present invention represent individual values and the darker point is the average of the values measured. It may be observed that it is not possible to compare values of Rmr between the present invention and the document U.S. Pat. No. 8,123,227 by virtue of the fact that that state of the art reveals a coating of hard amorphous carbon of a thickness of up to 2 micrometers, much less than the minimum thickness of 10 micrometers of the coating of the present invention. The values of Rmr are naturally greater for thin coatings, such that the greatest challenge lies in obtaining a thick coating having a high value of Rmr, this objective being achieved by the present invention.

Figure 7:
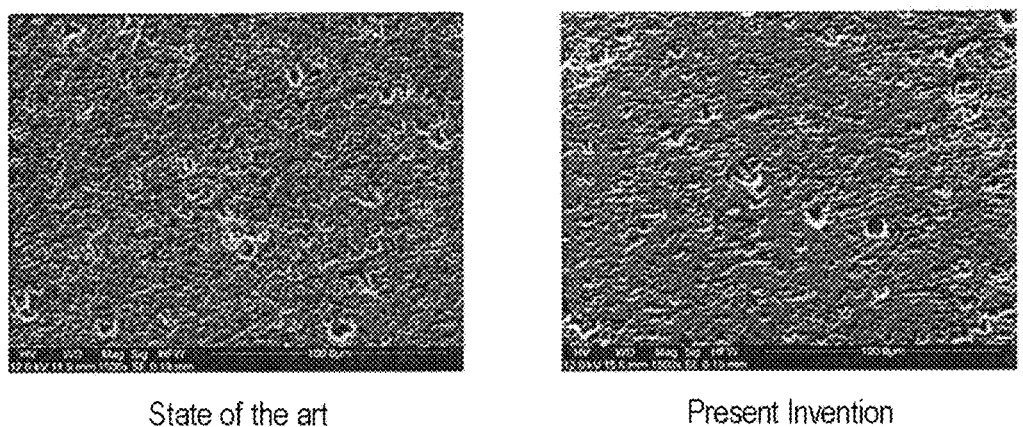
FIG. 7: photographs comparing the surfaces obtained in the state of the art and in the present invention.
Figure 8:
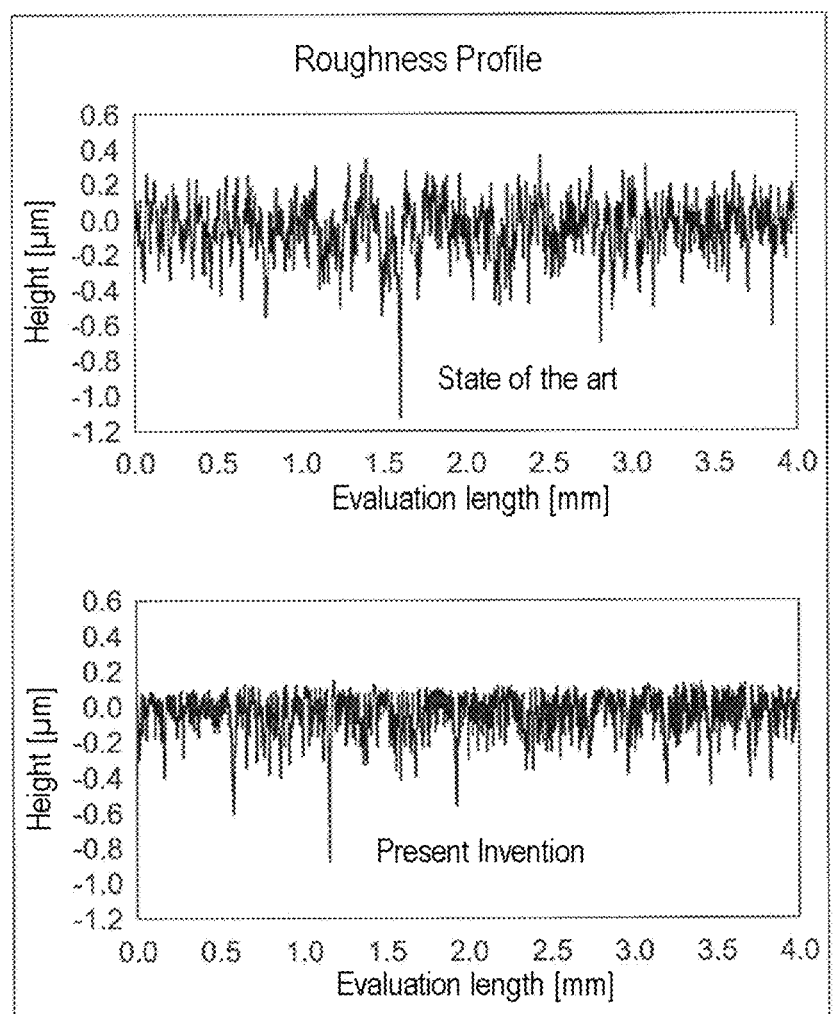
FIG. 8: graphs comparing the roughness profiles obtained in the state of the art and in the present invention.

Finally, FIGS. 7 and 8 show, respectively, the surface aspect and the roughness profile of the coating of the state of the art and of the present invention. The coating of the present invention may be observed in FIG. 7, comprising a more homogenous surface having less obvious/high peaks. On the other hand, FIG. 8 clearly shows the differences between the roughness profile of the coating of the state of the art, having deep valleys and high peaks, and the roughness profile of the present invention, having shallower valleys and lower peaks.

In summary, the sliding element of the present invention is provided with a coating of hard amorphous carbon offering the following advantages:

i) a coating presenting high hardness, of between 25 GPa and 50 GPa, having a thickness exceeding 10 micrometers, bringing about a reduction in the friction and wear, ensuring high durability;

ii) a good rate of deposition of the coating in combination with excellent finish, by virtue of the deposition of two layers of coating having differing percentages of $sp^3$ bonds and thicknesses, ensuring an Rz of less than 1 micrometer;

iii) good support between the contact surface of the sliding element and the contact surface of the liner 20, having high values of Rmr, Rmr(0.3-0.5) being equal to or exceeding 50% and/or Rmr(0.4-0.5) being equal to or exceeding 70%;

iv) a reduction in the running in period of the sliding element and cylinder liner 20 assembly, by virtue of the lower magnitude/height of the peaks, and a lower probability of the occurrence of scoring upon the surface of contact of the liner 20 during the running in, having a value of Rpk of less than 0.07 micrometers.

In this manner no doubt remains that the coating of substantially hydrogen free hard amorphous carbon of the present invention is capable of reconciling a good rate of deposition linked to an excellent finish, high hardness in combination with relief and reduction of internal stresses, thickness exceeding 10 micrometers in combination with a high Rmr, an Rz of less than 1 micrometer and an Rpk of less than 0.07 micrometers, and of bringing about better support and contact between two sliding surfaces, having good running in conditions, reducing the friction, the wear and the occurrence of scoring upon the sliding surfaces, ensuring excellent durability.

An example of preferred embodiment having been described, it shall be understood that the scope of the present invention comprises other possible variations, being limited solely by the content of the appended claims, the possible equivalents being included therein.

The invention claimed is:

1. A sliding element for an internal combustion engine comprising a base material having an annular external surface including a bonding layer, a first layer of coating and a second layer of coating sequentially disposed thereon, the first layer of coating and the second layer of coating including hard amorphous carbon (DLC) of a combined matrix having a plurality of sp3/sp2 bonds, wherein:
the first layer of coating includes 45% sp3 bonds or less and has a thickness of at least 10 micrometers; and
the second layer of coating includes at least 55% sp3 bonds and has a thickness of at least 3 micrometers.

2. The sliding element as claimed in claim 1, wherein a thickness of a total layer of coating defined by a combination of the first layer of coating and the second layer of coating is at least 15 micrometers.

3. The sliding element as claimed in claim 1, wherein the second layer of coating has a roughness profile having at least one of a Rmr(0.3-0.5) equal to or exceeding 50% and a Rmr(0.4-0.5) equal to or exceeding 70%.

4. The sliding element as claimed in claim 1, wherein the second layer of coating has a roughness profile having a Rpk of less than 0.07 micrometers.

5. The sliding element as claimed in claim 1, wherein the second layer of coating has a roughness profile having a Rz of less than 1 micrometer.

6. The sliding element as claimed in claim 1, wherein the second layer of coating has a hardness of 25 GPa to 50 GPa.

7. The sliding element as claimed in claim 1, wherein the bonding layer includes at least one of metallic chromium, nickel, cobalt, tungsten, and chromium carbide.

8. The sliding element as claimed in claim 1, wherein the bonding layer is deposited via physical vapor deposition (PVD).

9. The sliding element as claimed in claim 1, wherein the base material is composed of a ferrous metal.

10. The sliding element as claimed in claim 1, wherein the sliding element is structured as a piston ring.

11. An internal combustion engine comprising at least one sliding element including a base material having an annular external surface, the external surface including a bonding layer, a first layer of coating, and a second layer of coating sequentially disposed thereon, the first layer of coating and the second layer of coating including hard amorphous carbon (DLC) of a combined matrix having a plurality of sp3/sp2 bonds, wherein:
the first layer of coating includes 45% sp3 bonds or less and has a thickness of at least 10 micrometers; and
the second layer of coating includes at least 55% sp3 bonds and has a thickness of at least 3 micrometers.

12. The internal combustion engine as claimed in claim 11, wherein the second layer of coating has a roughness profile having at least one of a Rmr(0.3-0.5) equal to or exceeding 50% and a Rmr(0.4-0.5) equal to or exceeding 70%.

13. The internal combustion engine as claimed in claim 11, wherein the second layer of coating has a roughness profile having a Rpk of less than 0.07 micrometers and a Rz of less than 1 micrometer.

14. The internal combustion engine as claimed in claim 11, wherein the second layer of coating has a hardness of 25 GPa to 50 GPa.

15. A sliding element for an internal combustion engine comprising a base material having an annular external surface including a bonding layer, a first layer of coating, and a second layer of coating sequentially disposed thereon, the first layer of coating and the second layer of coating including hard amorphous carbon (DLC) of a combined matrix having a plurality of sp3/sp2 bonds, wherein:
the first layer of coating includes 45% sp3 bonds or less and has a thickness of at least 10 micrometers;
the second layer of coating includes at least 55% sp3 bonds and has a thickness of at least 3 micrometers; and
the second layer of coating has a roughness profile having a Rmr(0.3-0.5) equal to or exceeding 50% and a Rmr(0.4-0.5) equal to or exceeding 70%.

16. The sliding element as claimed in claim 15, wherein the roughness profile of the second layer of coating has a Rpk of less than 0.07 micrometers.

17. The sliding element as claimed in claim 15, wherein the roughness profile of the second layer of coating has a Rz of less than 1 micrometer.

18. The sliding element as claimed in claim 1, wherein the second layer of coating has a roughness profile having an Rmr(0.3-0.5) equal to or exceeding 50%.

19. The sliding element as claimed in claim 1, wherein the second layer of coating has a roughness profile having an Rmr(0.4-0.5) equal to or exceeding 70%.

20. The sliding element as claimed in claim 1, wherein the second layer of coating has a topography including a plurality of peaks and a plurality of valleys, the plurality of peaks having a height of less than 0.07 micrometers.

* * * * *